United States Patent [19]

Van De Steeg

[11] Patent Number: 4,769,709
[45] Date of Patent: Sep. 6, 1988

[54] PICTURE PICK-UP DEVICE INCLUDING A SOLID-STATE IMAGE SENSOR AND AN ELECTRONIC SHUTTER

[75] Inventor: Martinus J. H. Van De Steeg, Eindhoven, Netherlands

[73] Assignee: U.S. Philips Corporation, New York, N.Y.

[21] Appl. No.: 71,007

[22] Filed: Jul. 7, 1987

[30] Foreign Application Priority Data

Aug. 18, 1986 [NL] Netherlands ............... 8602091

[51] Int. Cl.$^4$ ............................................. H04N 3/14
[52] U.S. Cl. ............................. 358/213.19; 358/909; 358/213.31
[58] Field of Search ............ 358/213.19, 213.13, 358/213.31, 909; 357/24 LR

[56] References Cited

U.S. PATENT DOCUMENTS

| | | | |
|---|---|---|---|
| 4,573,077 | 2/1986 | Imai | 358/213.19 |
| 4,589,024 | 5/1986 | Koch et al. | 358/213.19 |
| 4,611,223 | 9/1986 | Hine et al. | 357/30 |
| 4,623,927 | 11/1986 | Hoshino | 358/213.19 |
| 4,684,992 | 8/1987 | Nakamura | 358/213.12 |
| 4,688,098 | 8/1987 | Kon et al. | 358/213.19 |
| 4,706,123 | 11/1987 | Chautemps | 358/213.19 |

Primary Examiner—Robert Lev
Attorney, Agent, or Firm—Jack E. Haken; William L. Botjer

[57] ABSTRACT

When using an image sensor (1) having at least a three-layer structure of semiconductor material of, for example, n-p-n conductivity type, in which an n-substrate (2) accommodates strip-shaped regions (3, 4) of alternately higher doped p-type and still higher doped n-type on a substrate side, and in which substrate the p-regions (3) extend to below the n-regions (4) and in which an electrode system (61-64) directed at right angles to the strip-shaped regions (3, 4) is present, an electronic shutter (2-6, SP) can be realized by using a shutter signal (CP1-4, SP) in which a shutter pulse (SP) is present during picture information integration periods so that a charge connection (2, 3, 4) for picture pick-up elements is produced. Consequently charge losses across biased, photosensitive semiconductor junctions (3, 4) and free charge packets under the electrode system (61-64) corresponding thereto can be replenished or depleted, respectively, at the shutter action.

3 Claims, 1 Drawing Sheet

400
PICTURE PICK-UP DEVICE INCLUDING A SOLID-STATE IMAGE SENSOR AND AN ELECTRONIC SHUTTER

BACKGROUND OF THE INVENTION

The invention relates to a picture pick-up device including a solid-state image sensor and an electronic shutter, which image sensor comprises in a semiconductor substrate picture pick-up elements for converting in a picture information integration period incident radiation into electric charge losses across biased semiconductor junctions and a parallel-in, series-out shift register coupled thereto for subsequently shifting, under the control of clock pulse signals supplied by a control signal generator, the electric charge losses to a sensor output terminal for the supply of a picture signal, the electronic shutter being active with a charge connection at the picture pick-up elements during a part of the picture information integration period under the control of a shutter signal supplied by the control signal generator.

A picture pick-up device of this type is described in U.S. Pat. No. 3,715,485. In this device the picture pick-up elements in the substrate are each formed with a light-radiation sensitive, biased semiconductor junction between p- and n-type semiconductor materials with a first switching transistor for coupling the photosensitive semiconductor junction to the shift register and with a second switching transistor for coupling the photosensitive semiconductor junction to the image sensor substrate under the control of the shutter signal. The patent describes that during a first adjustable part of the picture information integration period the second switching transistors to the substrate are conducting and constitute the charge connections so that the photosensitive semiconductor junctions do not accumulate electric charge loss as picture information. In the remaining second part of the picture information integration period all first and second switching transistors are turned off so that electric charge losses dependent on the intensity of the incident radiation are accumulated as picture information which are subsequently shifted via the first switching transistors to the parallel-in, series-out shift register. Consequently, the electronic shutter is active with an adjustable insensitive and sensitive period during the constant picture information integration periods. In the case of occurrence of a locally excessive exposure of given picture pick-up elements it is then avoided that information is spread to adjacent picture pick-up elements which would lead to a blooming effect upon display of the picture signal.

SUMMARY OF THE INVENTION

It is an object of the invention to provide the use of such an electronic shutter advantageously in a given known type of solid-state image sensor. To this end a picture pick-up device according to the invention is characterized in that—when using an image sensor having a layer structure of at least three layers of a semiconductor material of a first conductivity type, the second opposite conductivity type and the first conductivity type, respectively, with the substrate of doped first-type semiconductor material accommodating strip-shaped regions of alternately higher doped second and still higher doped first-type semiconductor material on a substrate side, in which substrate the regions of the second conductivity type extend to below the regions of the first conductivity type and have a decreasing thickness in the proximity of the central axis of these regions and in which an electrode system directed at right angles to the strip-shaped regions is present at the picture pick-up elements of the image sensor—the electronic shutter is active with a shutter signal which occurs during the said picture information integration periods with a shutter pulse so that the charge connection is present as a conducting connection between the strip-shaped regions of the first conductivity type and the substrate of the first conductivity type.

BRIEF DESCRIPTION OF THE DRAWING

The invention will be described in greater detail by way of example with reference to the accompanying drawing in which FIG. 1 diagrammatically shows in FIG. 1a a part of a picture pick-up device according to the invention and in FIG. 1b a cross-section of an image sensor present therein.

DETAILED DESCRIPTION OF THE PREFERRED EMBODIMENT

Figure 1:
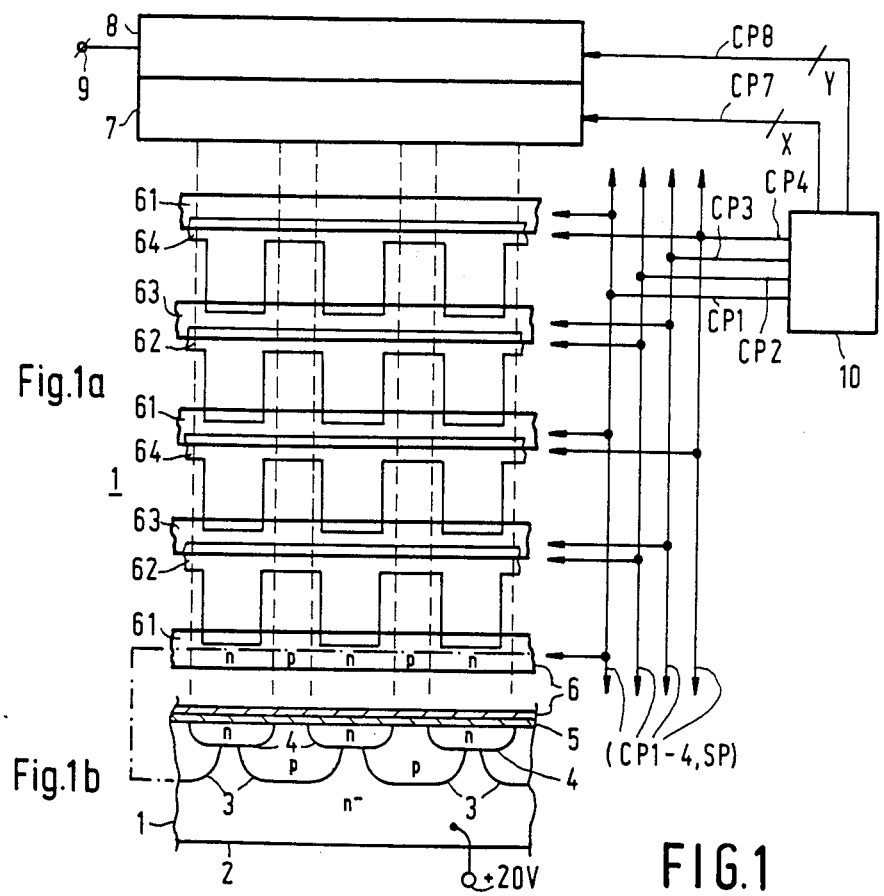

In FIG. 1 FIG. 1a is a dragrammatic elevational view of an image sensor 1 a cross-section of which is shown in FIG. 1b via a dot-and-dash line. The cross-section of FIG. 1b shows that the image sensor 1 is formed with a layer structure having at least three layers 2, 3 and 4 of a semiconductor material of n-conductivity type, opposite p-conductivity type and again n-conductivity type, respectively. Instead, a p-n-p layer structure would also be possible in which polarities of voltages to be described must be adapted. The layer 2 is denoted by n which implies a doping concentration of the n-type with, for example, approximately $5.10^{14}$ per cc. The layer 2 is present as a substrate, identically indicated, of n-type semiconductor material thus doped in which the layers 3 and 4 are alternately present on one side as strip-shaped regions identically indicated. The strip-shaped p-regions 3 have a higher doping concentration than the substrate and a doping concentration of approximately $3.10^{15}$ atoms per cc at the region surface is mentioned as an example. The strip-shaped n-regions 4 have a still higher doping concentration and a doping concentration of approximately $10^{16}$ atoms per cc at the region surface is mentioned as an example. In the elevational view of FIG. 1a the strip-shaped regions are shown by means of broken lines and they are indicated by n, p, n, p and n. In the substrate 2 the p-regions 3 extend to below the n-regions 4. The p-regions 3 are shown separately from each other in FIG. 1b but they could form a continuous layer. It is important that the layer 3 has a decreasing thickness in the proximity of the central axis of the n-regions 4. The image sensor 1 has a "vertical" transistor structure as described in which the n-regions 4 can be active as the source, the p-regions 3 as the gate and the substrate 2 as the drain. In this transistor structure p-n semiconductor junctions (3, 4) which are photosensitive are present between the regions 3 and 4. In the case of biased semiconductor junctions (3, 4) hole-electron pairs produced by photons of incident light radiation produce charge losses across these junctions.

The image sensor 1 shown in FIG. 1b is provided on its substrate side with the strip-shaped n- and p-regions 4 and 3, respectively, with a transparent insulting layer 5 on which an electrode strip 6 is present, which layers are shaded in the drawing. The electrode 6 forms part of a transparent system of electrodes (61–64) which is shown in FIG. 1a as a four-phase electrode system having a number of successive electrode strips 61 to 64. The four-phase electrode system (61–64) has been shown by way of example in connection with the image sensor embodiment described in literature to be referred to hereinafter.

In addition to the described part with the components 2 to 6 of FIG. 1b and the electrode system (61–64) of FIG. 1a, the image sensor 1 of FIG. 1 comprises a shift member 7 and a parallel-in, series-out shift register 8 which is coupled to a sensor output terminal 9. The shift member 7 may be in the form of a storage member for storage of picture information. The shift (and storage) member 7 and the shift register 8 are shielded from incident light radiation. The pick-up member with the electrode system (61–64) is the picture pick-up member which comprises picture pick-up elements for converting the incident radiation into electric charge losses across biased semiconductor junctions (3, 4).

Figure 2:
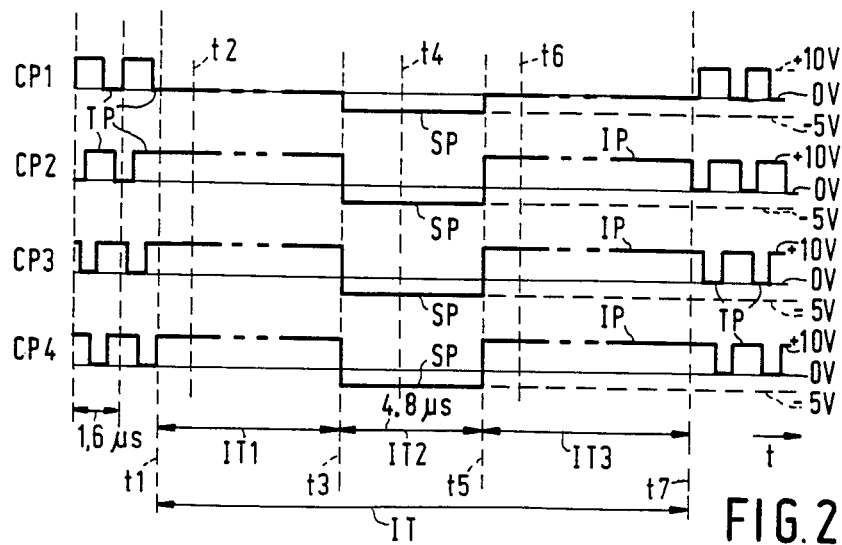
FIG. 2 shows some control signal diagrams as a function of time to illustrate the operation of the picture pick-up device of FIG. 1.

The layer structure of the image sensor 1 shown in FIG. 1b is described in an article in "IEEE Transaction on Electron devices", Vol. ED-32, No. 8, August 1985, pages 1430–1438, entitled "A Frame Transfer CCD Colour Imager with Vertical Antiblooming". For examples reference is made to this article for the correct doping concentration profiles at the strip-shaped regions 3 and 4. For the control of such an image sensor reference is made to a folder issued by Philips Electronics Components and Materials Division, Technical Publication 211, April 1986, entitled "The frame-transfer sensor". In FIG. 1a, in conformity with the folder, the reference numeral 10 denotes a control signal generator which is considered to supply control signals CP1, CP2, CP3 and CP4 to the electrode strips 61, 62, 63 and 64, respectively, and further control signals CP7 and CP8 to the shift (and storage) member 7 and the shift register 8, respectively. References x and y at the connection lead with the signals CP7 and CP8 indicate that these are in a multiphase form with several leads. For a detailed construction of the control signal generator 10 for supplying shift signals, clock pulse signals, pulses having a longer duration and combinations thereof, reference is made to the said folder. Based thereon, FIG. 2 shows some control signal diagrams as a function of time t for the control signals CP1, CP2, CP3 and CP4. In FIG. 1a the combination of these control signals for the electrode system (61–64) is denoted by CP1-4 as a part of a shutter signal (CP1-4, SP) to be described hereinafter. FIG. 2 shows some instants t1 to t7. Before the instant t1 and after the instant t7 shift clock pulses TP are present in known manner in the control signals CP1 to CP4. Starting from a clock pulse frequency of 2.5 MHz and a frequency division by the factor of 4 as indicated in the folder, the 90 phase-shifted shift clock pulses TP are generated by the generator 10 with a pulse period of 1.6 μs. FIG. 2 shows from the instant t1 to the instant t7 a picture information integration period denoted by IT. The period IT in FIG. 2 is divided into a first, second and third duration denoted by IT1, IT2 and IT3, respectively. FIG. 2 shows as an example that the duration IT2 between the instants t3 and t5 is equal to 4.8 μs, or in other words three times the period of the pulses TP. In practice this duration is found to be optimum for the effect to be obtained and to be described hereinafter, in the sensor embodiment described in the article when a minimum duration is aimed at. Instead, the duration IT2 may commence at the instant t1 instead of at the instant t3 which implies an absence of the duration IT1. FIG. 2 also shows that the pulses TP have an amplitude of between, for example, 0 V and +10 V. FIG. 1b indicates that the substrate 2 is connected, for example, to a connection conveying a voltage of +20 V. A particular aspect of the invention is that during the duration IT2 of the period IT there is a voltage of, for example, −5 V present in the control signals CP1 to CP4, that is to say, in the combination CP1-4 of these control signals. Due to the presence of the pulses at −5 V indicated as shutter pulses SP in FIG. 2, a shutter signal (CP1-4, SP) is active for an electronic shutter (2–6, SP) at the sensor 1 of FIG. 1. The picture information integration period IT is a maximum integration period in this case with a division into an adjustable insensitive duration (IT1+IT2) and a sensitive duration IT3. In FIG. 2 the reference IP denotes integration pulses at a voltage of +10 V at the control signals CP2, CP3 and CP4.

The following applies for explanation of the operation of the image sensor 1 and the electronic shutter (2–6, SP) active with the shutter signal (CP1-4, SP). The starting point is the instant t1 shown in FIG. 2. The voltage of 0 V is present via the signal CP1 at the electrode strips 61 and the strips 62, 63 and 64 convey the voltage of +10 V while the signals CP2, CP3 and CP4, respectively, are applied. The voltage of +10 V attracts electrons from the n-regions 4 so that the semiconductor junctions (3, 4) are biased. The electrons are attracted from the underlying and adjacent part of the region 4 and from the part located further away if the voltage of 0 V occurs on the overlying electrode strip. From the instant t1 photons of the incident light radiation will lead to electron hole pairs so that the voltage across the biased semiconductor junctions (3, 4) decreases. The charge loss at the semiconductor junction (3, 4) corresponds to a free negative charge under the electrode strips 62, 63 and 64, that is to say, with free charge packets present there whose size depends on the intensity of the local exposure and its duration. In this manner free charge packets occur under the electrode strips 62, 63 and 64 at the instant t2.

Subsequently the voltage of −5 V is applied to all electrode strips 61 to 64 at the instant t3. Consequently, all "vertical" transistors with sources 4 and drain 2 become conducting so that charge connections (2, 3, 4) are formed at the semiconductor junctions (3, 4). An example has been given in that from the instant t3 to the instant t4 the charge connections (2, 3, 4) convey current and are biased to the conducting state from the instant t4, whilst electron produced by photons are immediately depleted. At the instant t5 the state described with reference to instant t1 is present again and the light integration is re-initiated, with the instant t6 corresponding to the instant t2.

From the instant t7 the charge losses occurring at the semiconductor junctions (3, 4) are shifted in known manner as charge packets from below the electrode system (61–64) to the shift (and storage) member 7.

The structure of the image sensor 1 with the described layer structure and doping concentrations leads to an electronic shutter (2–6, SP) at the picture pick-up device having a satisfactory operation in practice. The charge losses across the biased, photo-sensitive semiconductor junctions (3, 4) and the free charge packets corresponding thereto under the electrode system (61-64) are replenished or depleted, respectively, during the shutter action.

If the picture signal occurring at the sensor output terminal 9 is used for television display after signal processing operations which are conventional in television, the picture pick-up device forms part of a television camera. A further possibility is to process the picture signal occurring at the terminal 9 to a signal suitable for cinematographic display so that the picture device forms part of a cinematographic camera as a pick-up member. A further possibility is to process the picture signal to a photographic or slide recording so that the picture pick-up device forms part of a photographic camera as a pick-up member. There are often pauses between photographic recordings. Starting from the described frame transfer design of the image sensor 1 with the pick-up member, the storage member and the shift register member the electronic shutter (2-6, SP) may be utilized in the case of photographic recording for obtaining the charge connection (2, 3, 4) at both the pick-up member and the storage member. Prior to the photographic recording the two members are cleared. This clearing operation can be performed by applying the shutter signal (CP1-4, SP) to the electrode systems of both the pick-up member and the storage member. In the case of a photographic recording there is still another solution for the clearing shutter action by applying the shutter signal with the shutter pulses of opposite polarity to the substrate which is common for the pick-up member and the storage member.

What is claimed is:

1. A picture pick-up device including a solid-state image sensor and an electronic shutter, which image sensor comprises in a semiconductor substrate picture pick-up elements for converting in a picture information integration period incident radiation into electric charge lossed across biased semiconductor junctions and a parallel-in, series-out shift register coupled thereto for subsequently shifting, under the control of clock pulse signals supplied by a control signal generator, the electric charge losses to a sensor output terminal for the supply of a picture signal, the electronic shutter being active with a charge connection at the picture pick-up elements during a part of the picture information integration period under the control of a shutter signal supplied by the control signal generator, characterized in that—when using an image sensor having a layer structure of at least three layers of a semiconductor material of a filrst conductivity type, the second opposite conductivity type and the first conductivity type, respectively, with the subtrate of doped first-type semiconductor material accomodating strip-shaped regions of alternately high doped second and still higher doped first-type semiconductor material on a substrate side, in which subsrtate the regions of the second conductivity type extend to below the regions of the first conductivity type and have a decreasing thickness in the proximity of the central axis of these regions and in which an elctrode system directed at right angles to the strip-shape regions is present at the picture pick-up elements of the image sensor—the electronic shutter is active with a shutter signal which occurs during the said picture information integration periods with a shutter pulse so that the charge connection is present as a conducting connection between the strip-shaped regions of the first conductivity type and the substrate of the first conductivity type.

2. A picture pick-up device as claimed in claim 1, characterized in that the shutter signal with the shutter pulse is applied to all electrodes of the said electrode system at the picture pick-up elements of the image sensor.

3. A picture pick-up device as claimed in claim 1, characterized in that the shutter signal with the shutter pulse is applied to the substrate of the image sensor.

* * * * *